United States Patent
Okoroanyanwu et al.

(10) Patent No.: US 8,586,269 B2
(45) Date of Patent: Nov. 19, 2013

(54) METHOD FOR FORMING A HIGH RESOLUTION RESIST PATTERN ON A SEMICONDUCTOR WAFER

(75) Inventors: Uzodinma Okoroanyanwu, Northampton, MA (US); Harry J. Levinson, Saratoga, CA (US); Ryoung-Han Kim, San Jose, CA (US); Thomas Wallow, San Carlos, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1022 days.

(21) Appl. No.: 11/726,433

(22) Filed: Mar. 22, 2007

(65) Prior Publication Data

US 2008/0233494 A1    Sep. 25, 2008

(51) Int. Cl.
*G11B 11/105*    (2006.01)
(52) U.S. Cl.
USPC .............................................. 430/21; 430/330
(58) Field of Classification Search
USPC .................................................... 430/21, 330
See application file for complete search history.

(56) References Cited

U.S. PATENT DOCUMENTS

| | | | | |
|---|---|---|---|---|
| 6,703,190 B2 * | 3/2004 | Elian et al. | | 430/324 |
| 7,402,782 B2 * | 7/2008 | Iwaki | | 219/635 |
| 2006/0094613 A1 * | 5/2006 | Lee | | 510/175 |
| 2007/0275321 A1 * | 11/2007 | LaFontaine et al. | | 430/270.1 |

FOREIGN PATENT DOCUMENTS

WO    2008/059440    5/2008

* cited by examiner

*Primary Examiner* — Daborah Chacko Davis
(74) *Attorney, Agent, or Firm* — Farjami & Farjami LLP

(57) ABSTRACT

In one disclosed embodiment, a method for forming a high resolution resist pattern on a semiconductor wafer involves forming a layer of resist comprising, for example a polymer matrix and a catalytic species, over a material layer formed over a semiconductor wafer; exposing the layer of resist to patterned radiation; and applying a magnetic field to the semiconductor wafer during a post exposure bake process. In one embodiment, the patterned radiation is provided by an extreme ultraviolet (EUV) light source. In other embodiments, the source of patterned radiation can be an electron beam, or ion beam, for example. In one embodiment, the polymer matrix is an organic polymer matrix such as, for example, styrene, acrylate, or methacrylate. In one embodiment, the catalytic species can be, for example, an acid, a base, or an oxidizing agent.

20 Claims, 5 Drawing Sheets

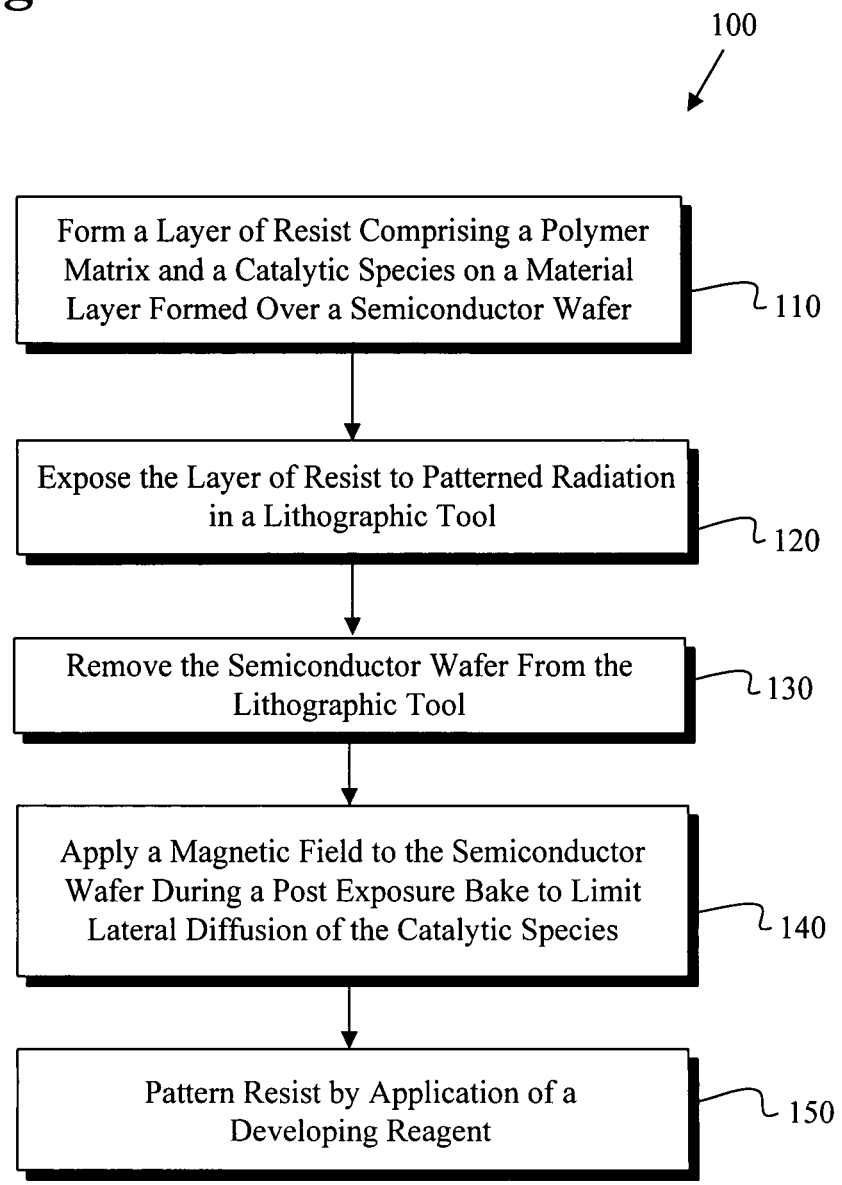

METHOD FOR FORMING A HIGH RESOLUTION RESIST PATTERN ON A SEMICONDUCTOR WAFER

TECHNICAL FIELD

The present invention is generally in the field of fabrication of semiconductor devices. More particularly, the invention is in the field of lithographic patterning of semiconductor wafers.

BACKGROUND ART

During semiconductor wafer fabrication, patterned radiation can be produced in a lithographic process to enable formation of very small patterns, such as nanometer-scale patterns, on a semiconductor wafer. In extreme ultraviolet (EUV) lithography, for example, a pattern formed on an EUV lithographic mask can be transferred to a semiconductor wafer by exposing a resist layer formed on the semiconductor wafer to EUV light reflected off of portions of a reflective surface.

Due to the very short wavelengths (high frequencies) used in EUV and other high resolution lithographic techniques, the patterning radiation utilized is highly absorbed by many resist materials. In addition, the radiation sources relied upon in some techniques are of limited brightness, EUV light sources for example, further limiting the radiation dose available for lithographic patterning.

A conventional approach to compensating for low source brightness and the high absorbance of patterning radiation is to utilize a resist material including a photo-activated catalytic species, for example a photo-acid, to chemically amplify a latent image formed on the resist. However, unresolved difficulty in adequately controlling diffusion of photo-acids at very small dimensions limits the ability of chemically catalyzed patterning methods to capture the ever finer patterns being produced in EUV and other high resolution lithographic techniques.

SUMMARY

A method for forming a high resolution resist pattern on a semiconductor wafer, substantially as shown in and/or described in connection with at least one of the figures, as set forth more completely in the claims.

BRIEF DESCRIPTION OF THE DRAWINGS

FIG. 1 shows a flow chart of an exemplary method to implement an embodiment of the present invention.

DETAILED DESCRIPTION OF THE INVENTION

The present invention is directed to a method for forming a high resolution resist pattern on a semiconductor wafer. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the present invention, which use the principles of the present invention, are not specifically described in the present application and are not specifically illustrated by the present drawings.

FIG. 1 shows a flowchart illustrating an exemplary method according to an embodiment of the present invention. Certain details and features have been left out of flowchart 100 that are apparent to a person of ordinary skill in the art. For example, a step may comprise one or more substeps or may involve specialized equipment or materials, as known in the art. While steps 110 through 150 indicated in flowchart 100 are sufficient to describe one embodiment of the present invention, other embodiments of the invention may utilize steps different from those shown in flowchart 100.

Figure 2A:
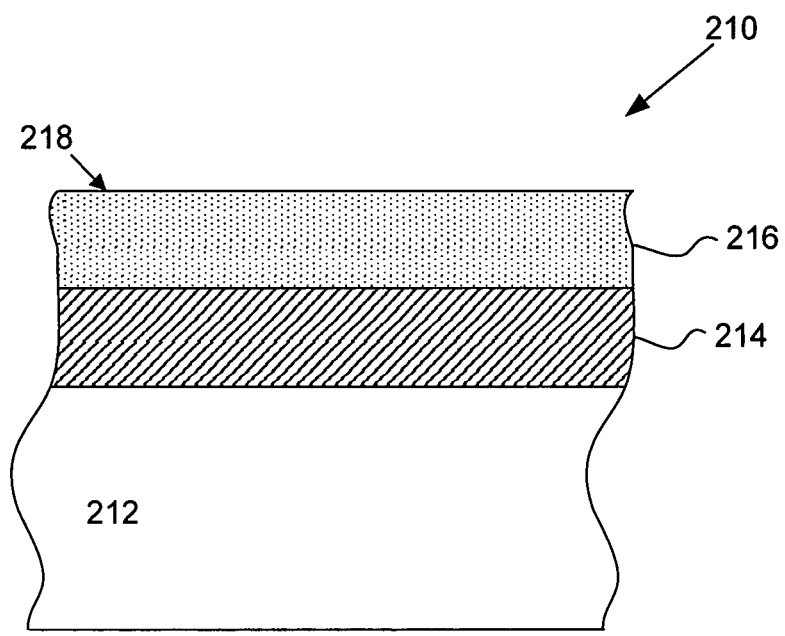
FIGS. 2A and 2B show exemplary structures corresponding to initial steps in the flow chart of FIG. 1.

Referring now to FIG. 2A, structure 210 of FIG. 2A shows a cross sectional portion of a semiconductor wafer prepared for lithographic patterning. Structure 210 shows a portion of semiconductor wafer 212, material layer 214, and a layer of resist 216 (also referred to simply as "resist 216" in the present application) having top surface 218, according to one embodiment of the invention shown in flowchart 100 of FIG. 1. In particular, structure 210 shows a portion of the semiconductor wafer before processing step 120 of flowchart 100.

Figure 2B:
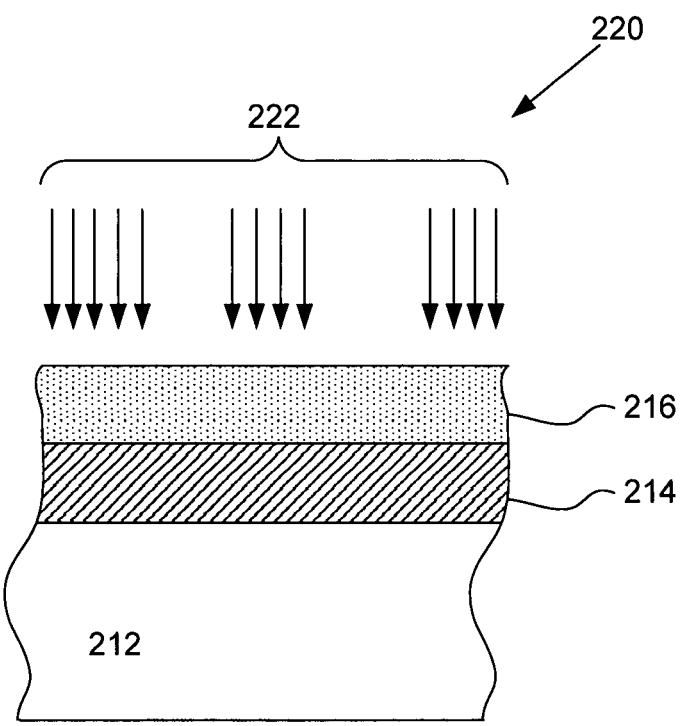
Figure 3:
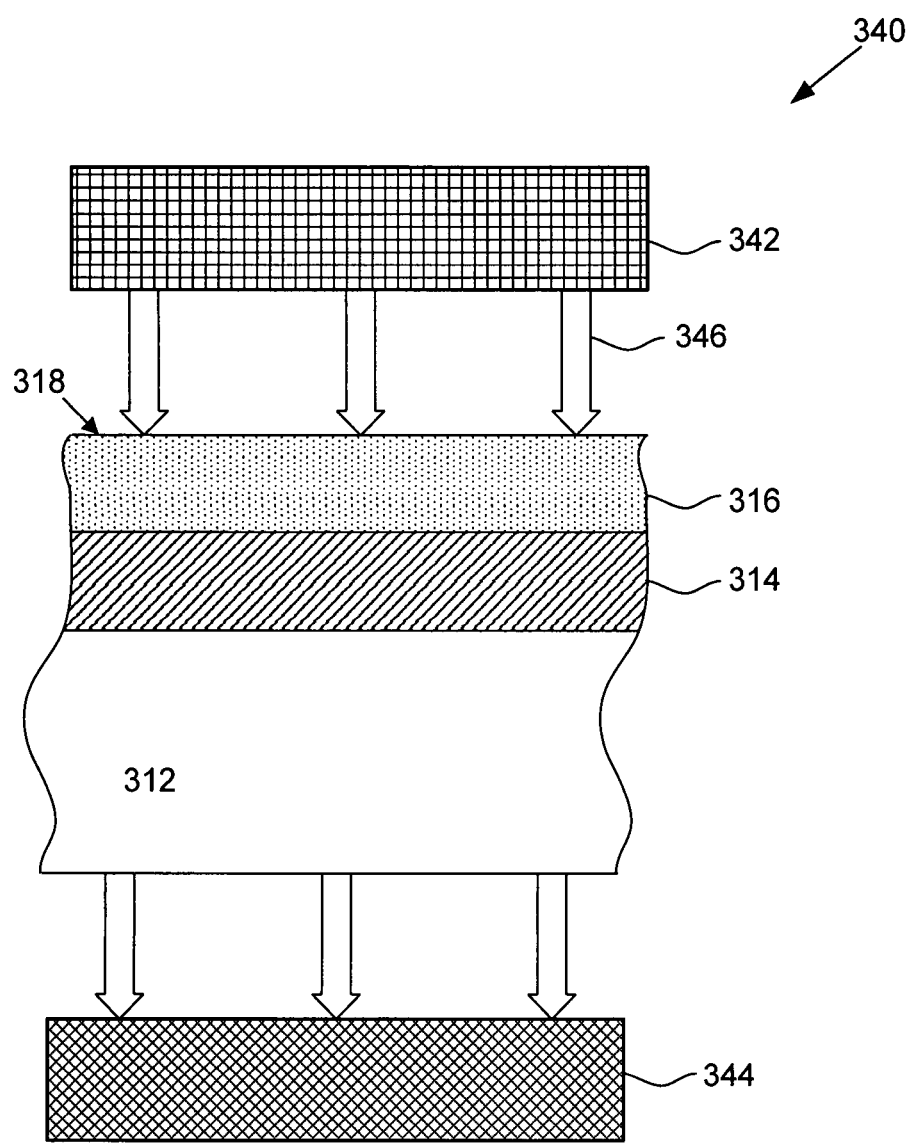
FIG. 3 shows an exemplary structure corresponding to an intermediate step in the flow chart of FIG. 1.
Figure 4:
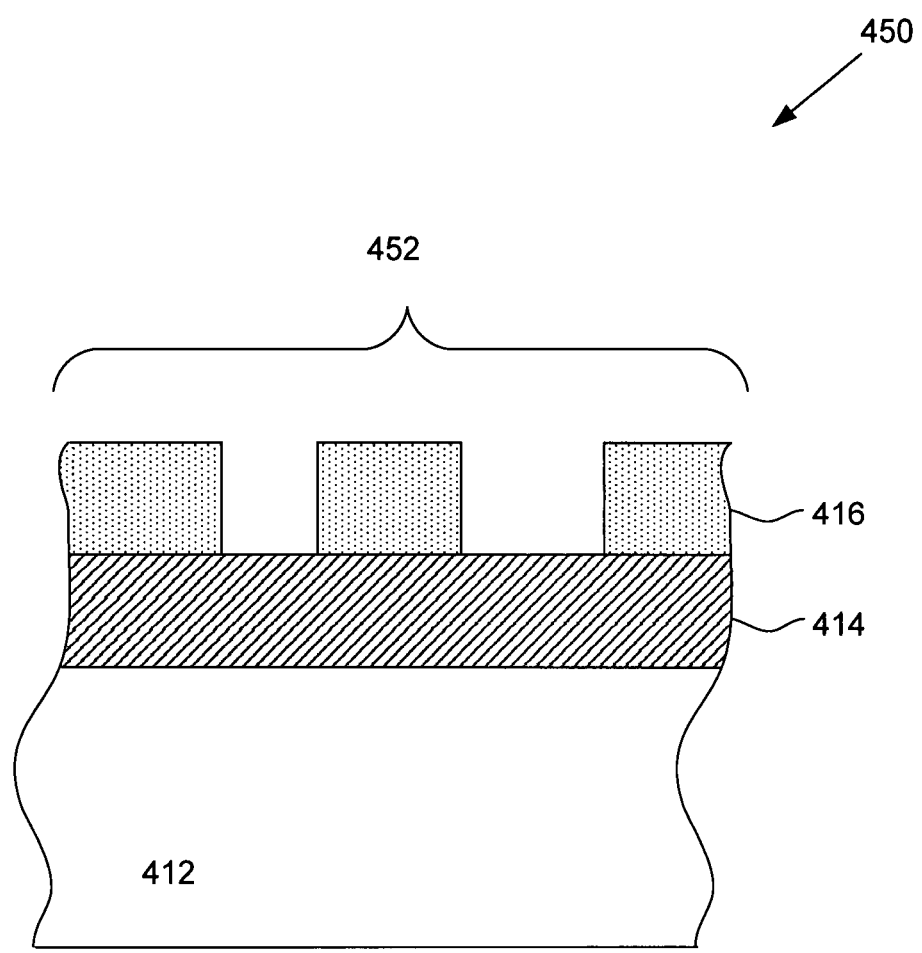
FIG. 4 shows an exemplary structure corresponding to a final step in the flow chart of FIG. 1.

Referring to FIGS. 2B, 3, and 4, structures 220, 340, and 450 show the result of performing, on structure 210, steps 120, 140, and 150 of flowchart 100 of FIG. 1, respectively. For example, structure 220 shows structure 210 during processing step 120, structure 340 shows structure 210 during processing of step 140, and so forth.

Continuing with step 110 in FIG. 1 and structure 210 in FIG. 2A, step 110 of flowchart 100 comprises formation of layer of resist 216 over material layer 214, situated over semiconductor wafer 212. Material layer 214 can comprise a conductive material, such as polysilicon, aluminum, or copper, or a dielectric material, such as silicon dioxide or silicon nitride, for example. In other embodiments, there may be more than one material layer, and those additional material layers between material layer 214 and semiconductor wafer 212 may include additional patterns, for example, circuits or connective traces.

In the embodiment of the invention in FIG. 1, layer of resist 216 can comprise a polymer matrix and one or more catalytic species. The polymer matrix can comprise an organic polymer material comprising functionalized styrene, norbornene, acrylate, or methacrylate monomers, for example. In other embodiments, resist 216 can comprise different organic or inorganic polymers. The catalytic species present in resist 216 may be, for example, an acid, base, or oxidizing agent, activated by exposure to patterned radiation. More specifically, resist 216 may include a photo-acid (also referred to simply as "acid" in the present application) as the catalytic species, for example. Resist 216 can be formed over material layer 214 by using a spin coat process or other suitable deposition process, as known in the art.

At step 120 in FIG. 1 and structure 220 in FIG. 2B, resist 216 is exposed to patterned radiation 222 under vacuum conditions in a lithographic tool in a lithographic process. During the lithographic process, a pattern on a lithographic mask (not shown) can be transferred to resist 216 formed over semiconductor wafer 212 by utilizing a low intensity radiation source, such as an extreme ultraviolet (EUV) light source. In another embodiment, an electron beam, or an ion beam may provide patterned radiation 222, for example. In the lithographic process, exposure to patterned radiation 222 activates the catalytic species in the resist so as to form a latent image corresponding to the pattern that is to be transferred to resist 216 from the lithographic mask.

Referring to step 130 of flowchart 100, the semiconductor wafer, which includes the resist, is removed from the lithographic tool for further processing. In the embodiment in FIG. 1, a vacuum environment is not required to perform the remaining process steps of flowchart 100. For example, the remaining process steps of flowchart 100 can be performed in a non-vacuum environment, such as air. However, the remaining process steps of flowchart 100 may also be performed in nitrogen, oxygen, or other suitable type of environment, for example.

Continuing with step 140 of flowchart 100 and structure 340 in FIG. 3, step 140 of flowchart 100 comprises applying a magnetic field perpendicular to top surface 318 of resist 316, during a post exposure bake process. As shown in FIG. 3, structure 340 includes resist 316 having top surface 318, material layer 314, and semiconductor wafer 312, corresponding respectively to resist 216, top surface 218, material layer 214, and semiconductor wafer 212, in FIG. 2A. Also shown in FIG. 3 are magnet 342, opposite polarity magnet 344, and magnetic field lines 346 (also referred to simply as "magnetic field 346" in the present application), having no analogues in previous figures.

Referring to FIG. 3, structure 340 includes magnetic field lines 346 which are substantially perpendicular to top surface 318 of resist 316. For simplicity, the present embodiment includes physical magnets 342 and 344 of opposite polarity, above and below semiconductor wafer 312, for example opposing North and South pole magnets. In other embodiments, magnetic field lines substantially perpendicular to top surface 318 may be provided by other magnetic field sources, for example a magnetic coil.

As is known in the art, a post exposure bake step can accelerate the amplification of a latent image formed on a resist, by accelerating the chemically catalyzed solubility changes activated by exposure to patterned radiation. For example, photo-activation of an acid catalyst (photo-acid) in a resist material may trigger solubility changes in the resist material, which are amplified in the resist through activity of the photo-acid. Post exposure baking accelerates that catalytic amplification of the latent image on the resist. The resulting solubility differential between exposed and unexposed areas of the resist facilitates development of the patterned resist in a subsequent step.

In conventional techniques, however, the advantages offered by methods for forming resist patterns through catalytic amplification of a latent image may be significantly offset by loss of final image resolution due to diffusion of the catalytic species during amplification. During the post exposure bake, it is desirable for catalytic activity to propagate a latent image vertically through a resist, from an exposure surface, such as top surface 318 in FIG. 3, to a material layer, such as material layer 314. During that process, there may be some tendency for the catalytic species to diffuse laterally, in a direction perpendicular to the desired direction of propagation, and across a boundary defining the border of a latent image formed during exposure to patterned radiation. Although undesirable in substantially all cases, the consequences of lateral diffusion are particularly troublesome in high resolution lithographic processes, for which even small dimensional deviations can result in substantial deterioration in resolution and contrast.

The present invention resolves the problems present in conventional approaches by limiting lateral diffusion of a catalytic species through application of a magnetic field during a post exposure bake process. Referring to step 140 of flowchart 100 and structure 340 in FIG. 3, opposing magnets 342 and 344 produce magnetic field lines 346 that are substantially perpendicular to top surface 318 of resist 316. As a result, magnetic field lines 346 are substantially in the direction of desired propagation of the latent image formed in step 120, and substantially perpendicular to directions corresponding to undesirable lateral diffusion of the catalytic species.

Application of a magnetic field to produce magnetic field lines 342 in FIG. 3 during a post exposure bake, is advantageous for several reasons related to the orientation of magnetic field lines 342 with respect both to a direction of desired image propagation, and a direction of lateral diffusion of a catalytic species. Regardless of the type of catalytic species present in resist 316, whether acid, base, or oxidizing agent, for example, that catalyst carries a net electrical charge, either positive or negative. As is well known, movement of a charged particle in a magnetic field results in a force applied to the moving particle in a direction perpendicular to its own direction of motion, and perpendicular to the direction of the magnetic field lines producing it. In other words, the magnetic force deflects the charged particle from its original course. The magnitude of that force varies according to the relative direction of motion of the particle, compared with the direction of the field. Thus, motion in the direction of field lines 342, i.e. a direction of desired image propagation, results in substantially no force being applied, while motion in a direction of lateral diffusion results in a maximum deflective force applied perpendicular to that undesirable direction of motion.

The consequence of applying a magnetic field producing field lines 346 in FIG. 3, at step 140 of flowchart 100, is that lateral diffusion of the catalytic species is limited, while propagation of the image through resist 316 is substantially unaffected. In this way, the present embodiment overcomes the disadvantages associated with lateral diffusion in conventional techniques, while retaining the sensitivity advantages available from use of a chemically catalyzed patterning process. The present invention thus enables use of chemically catalyzed patterning processes for use in forming high resolution resist patterns.

By way of specific example, in one embodiment, the source of patterned radiation in a high resolution lithographic process may be EUV light. In EUV lithography, the radiation that is used to transfer a pattern on a lithographic mask to resist formed on a semiconductor wafer typically has a low intensity as a result of, for example, high absorbance of EUV radiation by most materials. Consequently, post exposure amplification of the latent image produced by the patterned EUV light may be necessary to achieve a desired resist pattern when EUV light is utilized for pattern transfer. During a post exposure bake step in a conventional method, diffusion of the photoactive catalyzing species during acceleration of the image amplification process may result in reduced pattern resolution and contrast. Through use of the embodiment of FIG. 1, diffusion of a catalytic species is limited, while image amplification proceeds unabated. As a result, resist materials containing catalytic photo-acids, or example, may be used to produce high resolution lithographic patterns substantially free of the distortions introduced by diffusion of photo-acids in conventional techniques.

Continuing with step 150 of flowchart 100 and structure 450 in FIG. 4, a resist pattern is created corresponding to the patterned radiation. Structure 450 comprises resist 416, material layer 414, and semiconductor wafer 412, corresponding respectively to resist 216, material layer 214, and semiconductor wafer 212, in FIG. 2. Also shown in FIG. 4 is pattern 452 formed on resist 416 through the present invention's method for forming a high resolution resist pattern on a semiconductor wafer. Pattern 452 can be created by application of a developing reagent to the resist material in any suitable developing process, as known in the art. In the developing process, the resist can be immersed in a solution containing dissolution reagent, for example. Regardless of the developing process used, formation of the resist pattern is enabled by the catalytic amplification of solubility changes in the resist material, activated by exposure to patterned radiation in step 120, and accelerated by baking in step 140.

Thus, in the embodiment shown in flowchart 100 in FIG. 1, the invention enables the significantly increased exposure sensitivity to low intensity or highly attenuated radiation available through catalytic amplification of solubility changes in the resist material, by limiting diffusion of a catalytic species during image amplification. The present invention advantageously increases both resolution and contrast in lithographic processes relying on low intensity or highly attenuated radiation, while avoiding the diffusion problem endemic to conventional methods relying on, for example, acid catalysis, and well known in the art.

As a result of the method for forming a high resolution resist pattern on a semiconductor wafer, described in the exemplary embodiments set forth in the present application and shown by flowchart 100 in FIG. 1, a semiconductor wafer having one or more semiconductor dies is fabricated. In a subsequent step (not shown on flowchart 100) the semiconductor dies can be separated from the semiconductor wafer in a dicing process after wafer fabrication has been completed. The fabricated and separated semiconductor die, which is fabricated by using the present invention's method for forming a high resolution resist pattern on a semiconductor wafer, can be utilized on a circuit board, for example. The diced and separate dies can be packaged, i.e. can be enclosed and/or sealed in suitable semiconductor packages, as known in the art.

Figure 5:
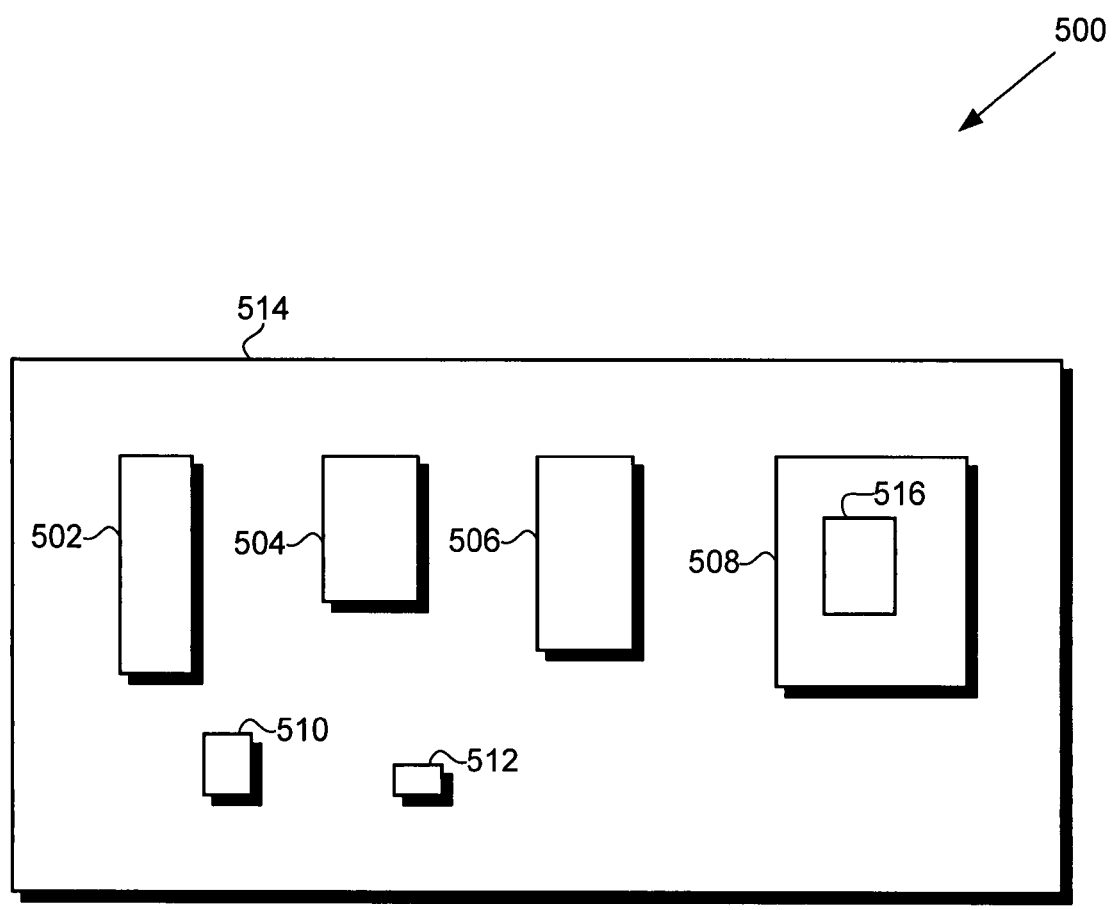
FIG. 5 is a diagram of an exemplary electronic system including an exemplary chip or die fabricated using a method for forming a high resolution resist pattern on a semiconductor wafer, in accordance with one or more embodiments of the present invention.

FIG. 5 is a diagram of an exemplary electronic system including an exemplary chip or die fabricated by using the present invention's method for forming a high resolution resist pattern on a semiconductor wafer, in accordance with one or more embodiments of the present invention. Electronic system 500 includes exemplary modules 502, 504, and 506, IC chip 508, discrete components 510 and 512, residing in and interconnected through circuit board 514. In one embodiment, electronic system 500 may include more than one circuit board. IC chip 508 can comprise a semiconductor die, which is fabricated by using an embodiment of the invention's method for forming a high resolution resist pattern on a semiconductor wafer. IC chip 508 includes circuit 516, which can be a microprocessor, for example.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is mounted on circuit board 514 and can comprise, for example, any semiconductor die that is fabricated by utilizing an embodiment of the invention's method for forming a high resolution resist pattern on a semiconductor wafer. In one embodiment, IC chip 508 may not be mounted on circuit board 514, and may be interconnected with other modules on different circuit boards. Further shown in FIG. 5, discrete components 510 and 512 are mounted on circuit board 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

Thus, a method for forming a high resolution resist pattern on a semiconductor wafer provides significantly increased exposure sensitivity to low intensity radiation, while avoiding the dimensional constraints imposed by diffusion of a catalytic species in conventional methods. By limiting lateral diffusion of a catalytic species, while amplifying the effect of exposure to low intensity or highly attenuated radiation through chemically catalyzed solubility changes in a resist material, the invention's method advantageously increases both resolution and contrast during lithographic processing of semiconductor wafers.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for forming a high resolution resist pattern on a semiconductor wafer has been described.

The invention claimed is:
1. A method for forming a high resolution resist pattern on a semiconductor wafer, said method comprising:
forming a layer of resist over said semiconductor wafer;

exposing said layer of resist to a patterned radiation to form a latent image corresponding to said high resolution resist pattern;

applying a magnetic field to said semiconductor wafer during a post exposure process to form said high resolution resist pattern, wherein said magnetic field is formed between a first magnet positioned above said semiconductor wafer and a second magnet positioned below said semiconductor wafer and a direction of field lines of said magnetic field is substantially in a desired direction of propagation of said latent image during said applying said magnetic field.

2. The method of claim 1 wherein said patterned radiation is delivered by an EUV light source.

3. The method of claim 1 wherein said patterned radiation is delivered by an electron beam.

4. The method of claim 1 wherein said patterned radiation is delivered by an ion beam.

5. The method of claim 1 wherein said magnetic field is substantially perpendicular to a top surface of said layer of resist.

6. The method of claim 1 wherein said post exposure process is a post exposure bake process.

7. The method of claim 1 wherein said layer of resist comprises a polymer matrix and a catalytic species.

8. The method of claim 7 wherein said catalytic species comprises an acid.

9. The method of claim 7 wherein said catalytic species comprises a base.

10. The method of claim 7 wherein said polymer matrix is an organic polymer matrix.

11. The method of claim 10 wherein said organic polymer matrix is selected from the group consisting of functionalized styrene, norbornene, acrylate, and methacrylate.

12. The method of claim 1 further comprising dicing said semiconductor wafer into a plurality of semiconductor dies.

13. The method of claim 12 further comprising utilizing one or more of said plurality of semiconductor dies in a circuit board.

14. The Method of claim 12 further comprising packaging one or more of said plurality of semiconductor dies.

15. The method of claim 12, wherein one or more of said plurality of semiconductor dies are utilized in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

16. A method for forming a high resolution resist pattern on a semiconductor wafer, said method comprising:

forming a layer of resist comprising a polymer matrix and a catalytic species over said semiconductor wafer;

exposing said layer of resist to a patterned radiation to form a latent image corresponding to said high resolution resist pattern;

applying a magnetic field to said semiconductor wafer to accelerate formation of said high resolution resist pattern, wherein said magnetic field is formed between a first magnet positioned above said semiconductor wafer and a second magnet positioned below said semiconductor wafer and a direction of field lines of said magnetic field is substantially in a desired direction of propagation of said latent image during said applying said magnetic field.

17. The method of claim 16 further comprising dicing said semiconductor wafer into a plurality of semiconductor dies.

18. The method of claim 17 further comprising utilizing one or more of said plurality of semiconductor dies in a circuit board.

19. The method of claim 16 wherein said catalytic species is selected from the group consisting of an acid, a base, and an oxidizing agent.

20. The method of claim 16 wherein said polymer matrix is an organic polymer matrix selected from the group consisting of functionalized styrene, norbornene, acrylate, and methacrylate.

* * * * *